(12) United States Patent
Morishita

(10) Patent No.: US 8,045,304 B2
(45) Date of Patent: Oct. 25, 2011

(54) SEMICONDUCTOR CIRCUIT INCLUDING ELECTROSTATIC DISCHARGE CIRCUIT HAVING PROTECTION ELEMENT AND TRIGGER TRANSISTOR

(75) Inventor: Yasuyuki Morishita, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 793 days.

(21) Appl. No.: 12/071,766

(22) Filed: Feb. 26, 2008

(65) Prior Publication Data

US 2008/0217650 A1    Sep. 11, 2008

(30) Foreign Application Priority Data

Mar. 7, 2007    (JP) .................................. 2007-057165

(51) Int. Cl.
*H02H 9/00*    (2006.01)
(52) U.S. Cl. .......................................... 361/56; 361/111
(58) Field of Classification Search .................... 361/56, 361/111
See application file for complete search history.

(56) References Cited

U.S. PATENT DOCUMENTS

| | | | |
|---|---|---|---|
| 6,545,321 B2 | 4/2003 | Morishita | |
| 7,071,528 B2 * | 7/2006 | Ker et al. | 257/492 |
| 7,256,976 B2 * | 8/2007 | Sato | 361/56 |
| 7,405,435 B2 * | 7/2008 | Sato | 257/173 |

FOREIGN PATENT DOCUMENTS

| | | |
|---|---|---|
| JP | 2003-203985 | 7/2003 |
| JP | 2003-318265 | 11/2003 |
| JP | 2006-303110 | 11/2006 |

OTHER PUBLICATIONS

M. Mergens, et al. Speed Optimized Diode-Triggered SCR (DTSCR) for RF ESD Protection of Ultra-Sensitive IC Nodes in Advanced Technologies, IEEE rans. Device Materi. Reliab. vol. 5, No. 3, pp. 532-542, Sep. 2005.
Keppens, et al., "ESD Protection Solutions for High Voltage Technologies", 2004 EOS/ESD Symposium.

* cited by examiner

*Primary Examiner* — Rexford Barnie
*Assistant Examiner* — Tien Mai
(74) *Attorney, Agent, or Firm* — McGinn IP Law Group, PLLC

(57) ABSTRACT

A semiconductor circuit includes, a first pad for a first power source, a second pad for a second power source, a third pad for an input/output signal, a protection element arranged between the third pad and the second pad; and a transistor functioning as a trigger element for use in flowing a trigger current to the protection element. The transistor includes a gate and a backgate being connected to the first pad and is connected to the protection element such that a source potential of the transistor becomes lower than a potential of the third pad, based on a voltage drop caused by the protection element, when potentials of the first pad and the third pad are kept at a power supply voltage level.

13 Claims, 7 Drawing Sheets

SEMICONDUCTOR CIRCUIT INCLUDING ELECTROSTATIC DISCHARGE CIRCUIT HAVING PROTECTION ELEMENT AND TRIGGER TRANSISTOR

BACKGROUND OF THE INVENTION

1. Field of the Invention

This invention relates to a semiconductor circuit and more particularly to a semiconductor integrated circuit on which an electrostatic discharge (ESD) protection circuit for use in preventing damage to an internal circuit caused by an ESD and application of surges is installed.

2. Description of Related Art

On the semiconductor integrated circuit is installed an ESD protection circuit for use in protecting an internal circuit against a surge applied to input/output pads. One of the well-known circuit topologies in the ESD protection circuit is a circuit topology using a silicon controlled rectifier (SCR). The ESD protection circuit using the SCR has an advantage that a discharging capability for performing an active operation is high when the surge is inputted, and this circuit is thus widely used.

The ESD protection circuit using the SCR is typically constituted by a SCR and a trigger element connected to the gate of the SCR. One of the elements to be used as the trigger element is a PMOS transistor. For example, Japanese Patent Laid-Open Application No. 2003-318265 discloses an ESD protection circuit having a configuration in which the PMOS transistor is connected to the gate of P gate-type SCR (refer to FIG. 1). The ESD protection circuit in FIG. 1 is constituted by the SCR and the PMOS transistor 105. Anode of the SCR is connected to an I/O pad 102, and its cathode is connected to VSS pad 103. The gate of the SCR is connected to a drain of the PMOS transistor 105. The gate of the PMOS transistor 105 is connected to a VDD pad 101, and its source and backgate are connected to the I/O pad 102. Further, although FIG. 2 of Japanese Patent Laid-Open Application No. 2003-318265 illustrates the ESD protection circuit where the input circuit 104 is connected to the VDD pad 101, this illustration would be an erroneous expression.

In addition, as the trigger element, the NMOS transistor may also be used. Japanese Patent Laid-Open Application No. 2003-203985 and its corresponding U.S. Patent Application, i.e. U.S. Pat. No. 6,545,321 disclose an ESD protection circuit having a configuration in which the NMOS transistor acting as a trigger element is connected to the gate of N-gate type SCR. In addition, Japanese Patent Laid-Open Application No. 2006-303110 discloses a configuration in which the PMOS transistor is used as the trigger element and also the NMOS transistor is used.

In addition, as already been disclosed in the reference: M. Mergens et al., IEEE rans. Device Materi. Reliab. vol. 5, no. 3, pp. 532-542, September 2005, it is also possible to use diodes connected in series as the trigger element. FIG. 2 shows a configuration of the ESD protection circuit having such a configuration as above. The ESD protection circuit shown in FIG. 2 is constituted by the SCR and the diodes 106 connected in series. Anode of the SCR is connected to the I/O pad 102 and its cathode is connected to the VSS pad 103. As the trigger element, the diodes 106 connected in series in a forward direction from the gate of the SCR toward the VSS pad 103 are used.

One requirement applied to the ESD protection circuit consists in the fact that a leakage current at the I/O pad is low during normal operation. That is, under a condition in which the VDD pad is kept at the power supply voltage level VDD and the VSS pad is kept at the ground level VSS, it is preferable that the leakage current flowed from the I/O pad through the ESD protection circuit is low. The leakage current in the I/O pad is important in reduction of a consumption current in the semiconductor integrated circuit.

Another requirement applied to the ESD protection circuit consists in a low trigger voltage in which the SCR starts to operate during ESD stress condition, in particular, a low trigger voltage when an ESD stress of positive voltage for the VSS pad is applied to the I/O pad. A circuit topology using the SCR shows a tendency that the trigger voltage becomes high when the ESD stress of positive voltage for the VSS pad is applied to the I/O pad, in particular. If the trigger voltage is high, it shows a certain problem because an internal circuit may be damaged.

However, the aforementioned ESD protection circuit cannot satisfy these both requirements. For example, although the ESD protection circuit shown in FIG. 1 can reduce the trigger voltage of the SCR, it cannot reduce the leakage current of the I/O pad. A reason why this occurs consists in the fact that a value of leakage current in the I/O pad 102 when "High" level (i.e. a power supply voltage level VDD) is applied to the I/O pad 102 is determined by an off-leakage current $I_{OFF}$ of the PMOS transistor 105. In this case, the off-leakage current $I_{OFF}$ is a drain-source current $I_{DS}$ when both a gate-source voltage $V_{GS}$ and a backgate-source voltage $V_{BS}$ of the PMOS transistor 105 are 0V. With such a configuration as described above, the leakage current at the I/O pad 102 cannot be reduced to a value less than the off-leakage current $I_{OFF}$ of the PMOS transistor 105.

Even the ESD protection circuit in FIG. 2 can reduce the trigger voltage of the SCR by reducing the number of the diodes 106. However, the leakage current at the I/O pad 102 is high because the diodes 106 are connected in a forward direction toward the ground line (the power source line connected to the VSS pad 103).

B. Keppens et al., EOS/ESD Symposium Proceedings, 4B.7, 2004 disclose the ESD protection circuit for satisfying aforementioned both two requirements. FIG. 3A shows a circuit diagram indicating a configuration of the ESD protection circuit disclosed in this document. The ESD protection circuit in FIG. 3A is provided with N-gate type SCR. The anode of the SCR is connected to the I/O pad 102 and its cathode is connected to the VSS pad 103. A gate G2 of the SCR is connected to the VDD pad 101 through a resistor R2.

FIG. 3B is a view for showing a sectional structure of the semiconductor integrated circuit for realizing the ESD protection circuit shown in FIG. 3A. The ESD protection circuit shown in FIG. 3A is integrated at the P-type substrate 111 having N-well 112 formed the rein. The P-type substrate 111 is formed with P$^+$ region 113 and N$^+$ region 114, and the P$^+$ region 113 and N$^+$ region 114 are connected to the VSS pad 103. In this case, P$^+$ region is a region where P-type impurities are doped under a high concentration and N$^+$ region is a region where N-type impurities are doped under a high concentration. In addition, an N-well region 112 is formed with a P$^+$ region 115 and an N$^+$ region 116. The P$^+$ region 115 is connected to the I/O pad 102 and the N$^+$ region 116 is connected to the VDD pad 101. The P$^+$ region 115, N-well 112, P-type substrate 111 and N$^+$ region 114 act as a SCR (having PNPN structure). The P$^+$ region 113, N$^+$ region 114, P$^+$ region 115, and N$^+$ region 116 are separated from each other by field oxide films 117. The resistor of the P-type substrate 111 acts as a resistor element R1 in FIG. 3A and a resistor of the N-well 112 acts as a resistor element R2.

A leakage current at the I/O pad 102 is less in the ESD protection circuit of FIG. 3A because the gate G2 of the SCR is clamped at the power source voltage level VDD during its normal operation. In addition, when the ESD stress of positive voltage is applied to the I/O pad against the VSS pad 103, the VDD pad 101 is of a floating condition, so that a forward biasing may easily be applied between the anode and gate G2 of the SCR. Accordingly, the ESD protection circuit in FIG. 3A can reduce the trigger voltage of the SCR.

However, the ESD protection circuit in FIG. 3A shows a problem that a pn junction between the P$^+$ region 115 and N-well 112 may easily be damaged when an ESD stress of negative polarity for the VDD pad 101 is applied against the I/O pad 102. This problem is particularly serious when an area of the pn junction between the P$^+$ region 115 and N-well 112 is reduced so as to reduce a parasitic capacitance of the SCR. Accordingly, the ESD protection circuit in FIG. 3A cannot be a practical one.

As described above, it is believed that it has not been well known in the art that such a practical technology as one satisfying the two requirements of reduction of the leakage current at the I/O pad under the normal operating state and reduction of trigger voltage when the ESD stress of positive voltage is applied to the I/O pad with respect to the VSS pad.

SUMMARY OF THE INVENTION

The semiconductor circuit of the present invention comprises exemplarily a VDD pad, an I/O pad, a VSS pad, a protection element arranged between the I/O pad and the VSS pad, and a PMOS transistor acting as a trigger element for flowing a trigger current in the protection element. The gate and backgate of the PMOS transistor are connected to the VDD pad. The aforementioned protection element is constituted such that the potential at the source of the PMOS transistor is lower than the potential of the I/O pad due to a voltage drop generated at the protection element when the potentials of the VDD pad and I/O pad are kept at the power supply voltage level.

In such a semiconductor circuit having such a configuration as described above, it is possible to reduce the subthreshold current flowing through the PMOS transistor under the normal operating state. A reason why this state can be attained consists in the fact that the gate-source voltage of the PMOS transistor becomes a positive voltage because the potential of source of the PMOS transistor is lower than the potential of the VDD pad due to a voltage drop generated at the protection element. Thus, the semiconductor circuit of the present invention can reduce the leakage current at the I/O pad.

In addition, the semiconductor circuit of the present invention has an advantage that a trigger voltage when the ESD stress of a positive voltage for the VSS pad is applied to the I/O pad is low. In the case that the ESD stress of a positive voltage for the VSS pad is applied to the I/O pad, the VDD pad is kept floating to cause the gate and backgate of the PMOS transistor to become a floating state. In addition, the ESD stress of a positive voltage for the VSS pad is applied to the I/O pad to cause the source potential of the PMOS transistor to become a positive potential for the VSS pad. Accordingly, the potential of the I/O pad required for lowering the gate-source voltage of the PMOS transistor than a threshold voltage V$_{TH}$ is low. Accordingly, the trigger voltage when the ESD stress of a positive voltage for the VSS pad is applied to the I/O pad is reduced.

Preferably, a SCR is used as the protection element. In this case, the anode of the SCR is connected to the I/O pad, its cathode is connected to the VSS pad and its gate is connected to the source of the PMOS transistor.

According to the present invention, it is possible to provide an ESD protection circuit having a low leakage current under a normal operating state and having a low trigger voltage at the time of application of the ESD stress.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Embodiment

Figure 4A:
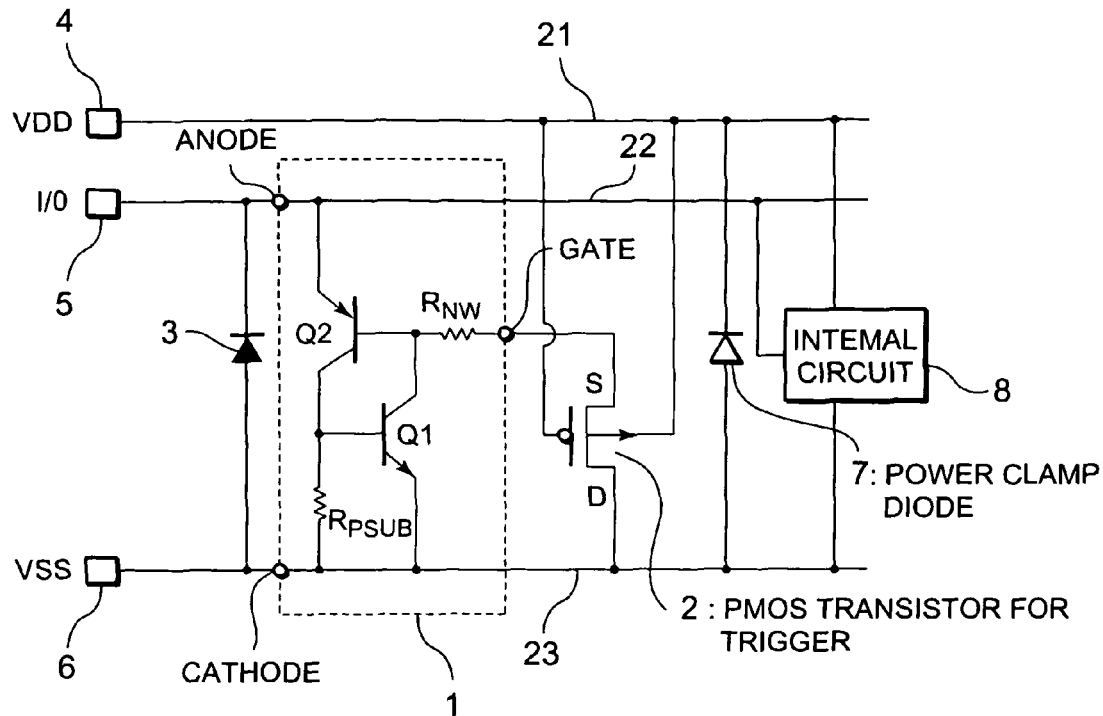
FIG. 4A is a circuit diagram for showing a configuration of the ESD protection circuit of a first embodiment of the present invention.

FIG. 4A is a circuit diagram for showing a configuration of the ESD protection circuit of a first embodiment of the present invention. The ESD protection circuit of the first embodiment comprises an N-gate type SCR 1, the PMOS transistor 2 for a trigger and a backward diode 3.

The SCR 1 acts as a protection element for discharging a load accumulated in the I/O pad 5 when the ESD stress (or surge) of a positive polarity is applied to the I/O pad 5. In FIG. 4A, the SCR 1 is equivalently expressed as it comprises NPN transistor Q1 and PNP transistor Q2. The anode of the SCR 1 is connected to the I/O pad 5 and its cathode is connected to the VSS pad 6. In this case, the I/O pad 5 is a pad connected to a signal line 22 for inputting or outputting a signal in respect to an internal circuit 8, and the VSS pad 6 is a pad to which the ground potential VSS is supplied from an external unit. The VSS pad 6 is connected to a VSS power supply line 23.

The PMOS transistor 2 for a trigger has a function for turning on the SCR 1. The PMOS transistor 2 for a trigger has its source connected to the gate of the SCR 1, its drain connected to the VSS power supply line 23 (i.e. VSS pad 6) and its gate and backgate connected to the VDD pad 4. In this case, the VDD pad 4 is a pad to which the power supply potential VDD is supplied from an external unit. The VDD pad 4 is connected to the VDD power supply line 21.

The backward diode 3 has a function for discharging a load accumulated in the VSS pad 6 when the ESD stress (or surge) of a positive polarity for the I/O pad 5 is applied to the I/O pad with respect to the VSS pad 6. The cathode of backward diode 3 is connected to the I/O pad 5 and the anode of backward diode 3 is connected to the VSS pad 6.

Supplying of the power supply voltage to the internal circuit 8 is carried out by the VDD power supply line 21 and the VSS power supply line 23. A power clamp diode 7 is connected between the VDD power supply line 21 and the VSS power supply line 23. The power clamp diode 7 may act as a protection element between the VDD pad 4 and the VSS pad 6.

Figure 4B:
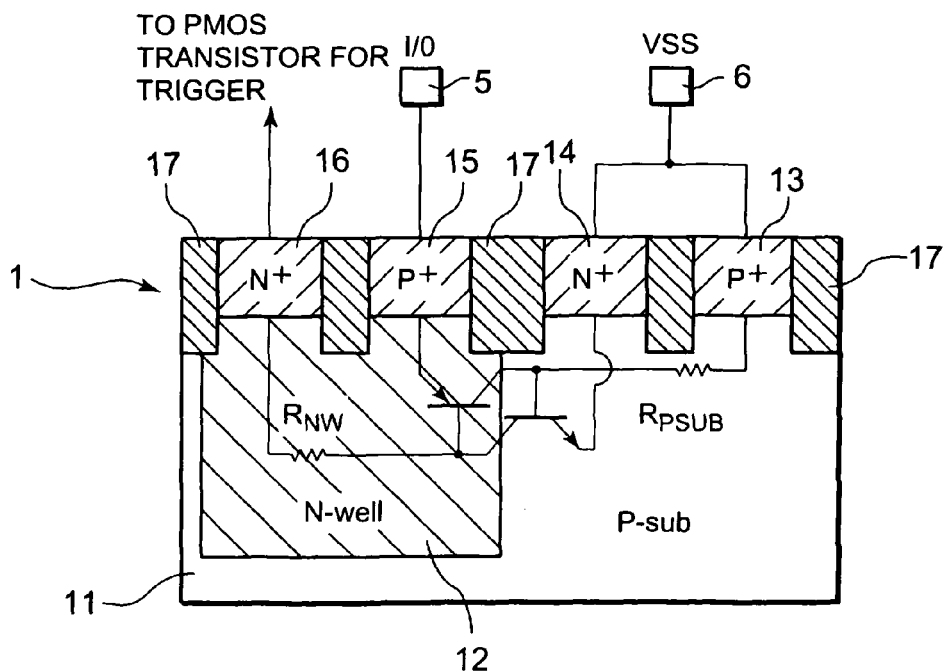
FIG. 4B is a sectional view for showing a sectional structure of a SCR included in the ESD protection circuit of FIG. 4A.

FIG. 4B is a view for showing a sectional structure of the SCR 1. The SCR 1 is integrated on a P-type substrate 11 having an N-well 12 formed thereon. The P-type substrate 11 is formed with P$^+$ region 13 and N$^+$ region 14, and the P$^+$ region 13 and N$^+$ region 14 are connected to the VSS pad 6. N$^+$ region 14 may act as a cathode for the SCR 1. In addition, P$^+$ region 15 and N$^+$ region 16 are formed in the N-well 12. P$^+$ region 15 is connected to the I/O pad 5, and N$^+$ region 16 is connected to the source of the PMOS transistor 2 for a trigger. P$^+$ region 15 acts as the anode of the SCR and N$^+$ region 16 acts as a gate. P+ region 13, N$^+$ region 14, P$^+$ region 15 and N$^+$ region are separated from each other by the field oxide film 17. A resistor $R_{PSUM}$ of P-type substrate 11 acts as a resistor for applying a bias to NPN transistor Q1, and a resistor $R_{NW}$ of N-well 12 acts as a resistor connected between the gate of the SCR 1 and the base of PNP transistor Q2.

The ESD protection circuit having such a configuration as above enables a leakage current at the I/O pad 5 to be reduced under a normal operating state, and also enables the trigger voltage to be reduced when the ESD stress of a positive voltage for the VSS pad 6 is applied to the I/O pad 5. A reason why such an advantage as above will be described in detail.

At first, a principle of reduction in leakage current of the I/O pad 5 under a normal operating state will be described. A reason why the leakage current at the I/O pad 5 is reduced under the normal operating condition consists in the fact that the potential at the source of the PMOS transistor for a trigger is kept at a lower potential than that of the gate and the backgate of the PMOS transistor 2 for a trigger (even if the I/O pad 5 is a power supply voltage level VDD) due to a voltage drop at the pn junction between the anode and the gate of the SCR 1. The leakage current at the I/O pad 5 under the normal operating state is mainly determined by a sub-threshold current at the PMOS transistor 2 for a trigger (since currents flowing in the SCR 1 and the backward diodes 3 are quite low as compared with the current flowing at the PMOS transistor 2 for a trigger, it can be ignored). The sub-threshold current flowing at the PMOS transistor 2 for a trigger is decreased in a manner of an exponential function as the gate-source voltage $V_{GS}$ and the gate-backgate voltage $V_{BS}$ of the PMOS transistor 2 for a trigger are increased. In this case, the gate-source voltage $V_{GS}$ and the gate-backgate voltage $V_{BS}$ of the PMOS transistor 2 are the potential of the gate and the potential of the backgate, respectively, when the source is applied as a reference value. Under the normal operating state, the gate and the backgate of the PMOS transistor for a trigger are kept at the power source voltage level VDD and in turn the source of the PMOS transistor 2 for a trigger is kept at a lower potential than that of the power source voltage level VDD only by a value of the voltage drop of the anode-gate (i.e. the emitter/base junction of PNP transistor Q2) of the SCR 1. In other words, the gate-source voltage $V_{GS}$ and the gate-backgate voltage $V_{BS}$ of the PMOS transistor 2 for a trigger are increased only by an amount corresponding to the voltage drop between the anode-gate of the SCR 1. Accordingly, the ESD protection circuit of the embodiment can extremely decrease the sub-threshold current flowing at the PMOS transistor 2 for a trigger, i.e. a leakage current at the I/O pad 5.

Figure 1:
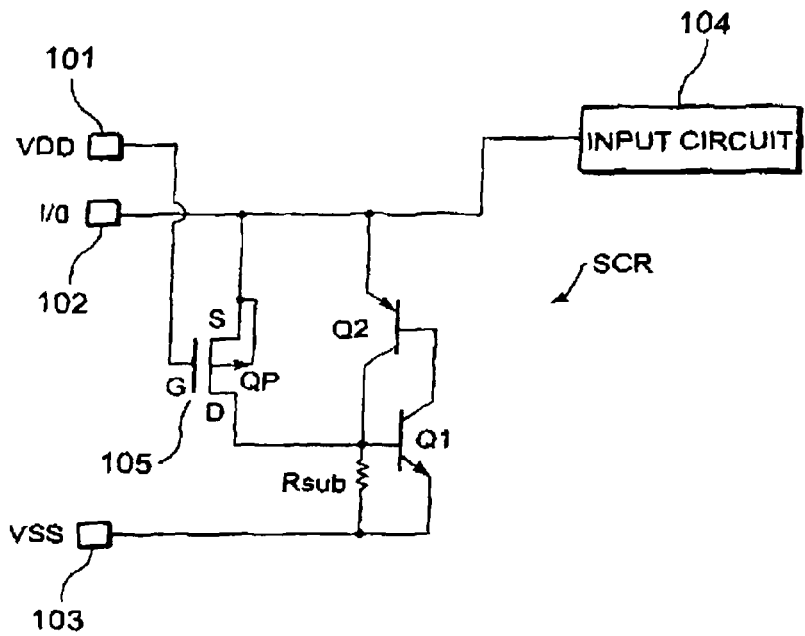
FIG. 1 is a circuit diagram for showing an example of a configuration of the related art ESD protection circuit.

The reduction in the leakage current at the ESD protection circuit of the embodiment would be understood more clearly if it is compared with that of the ESD protection circuit shown in FIG. 1. In the ESD protection circuit in FIG. 1, the leakage current of the I/O pad 102 under the normal operating state coincides with the sub-threshold current of the PMOS transistor 105 when the gate-source voltage $V_{GS}$ and the backgate-source voltage $V_{BS}$ are 0 V. In turn, in the ESD protection circuit of the embodiment is quite low as compared with the sub-threshold current flowing at the PMOS transistor 105 in the ESD protection circuit in FIG. 1.

Figure 5A:
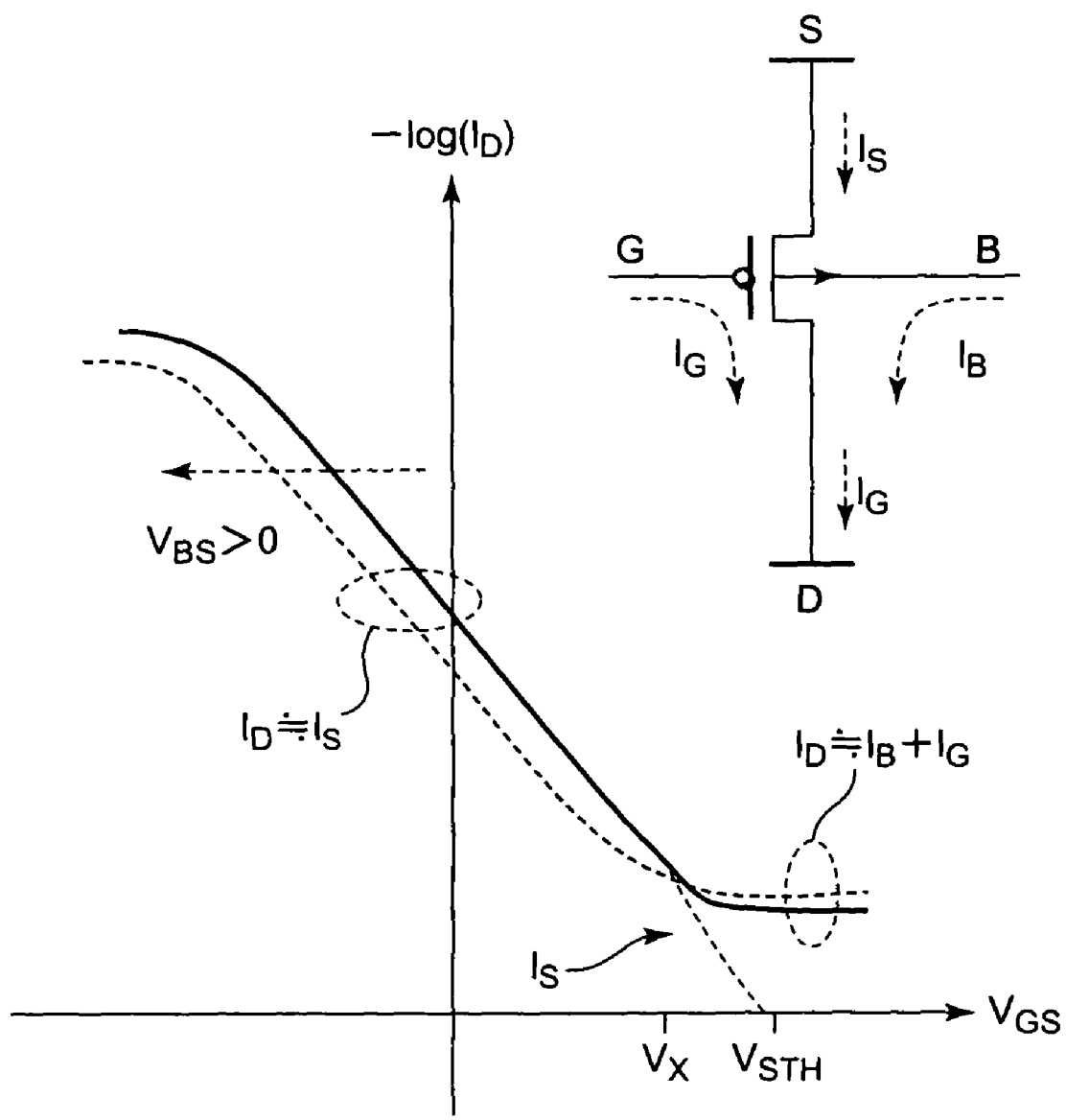
FIG. 5A is a graph for indicating an operating characteristic of the PMOS transistor, in particular, a relation between the gate-source voltage V$_{GS}$ and the drain current I$_D$.
Figure 5B:
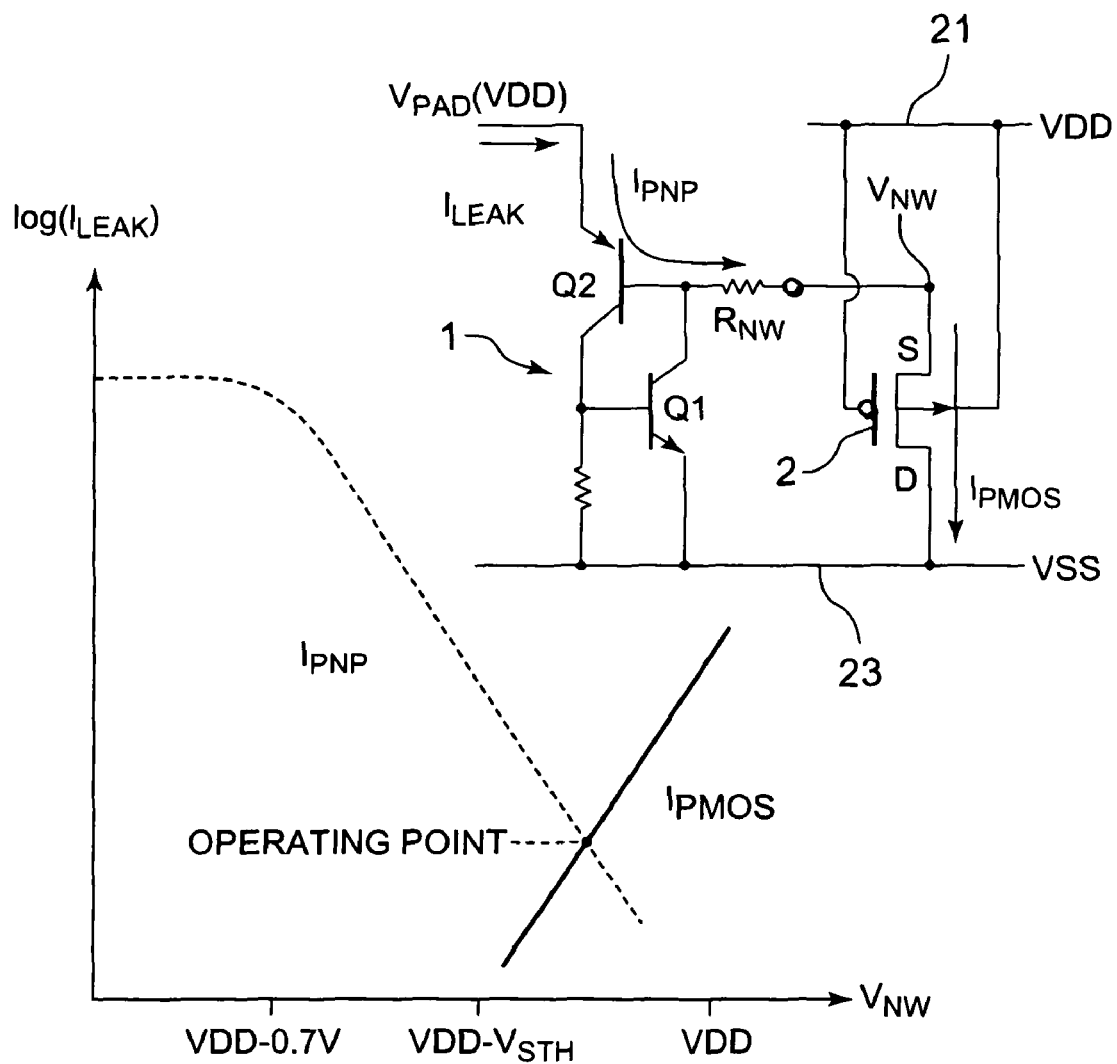
FIG. 5B is a graph for indicating an operating point of a leakage current under a normal operating state in the ESD protection circuit of FIG. 4A.

FIG. 5A and FIG. 5B are graphs for showing a more detailed illustration of a principle in which a leakage current at the I/O pad 5 is reduced during normal operation. In the following description, a "High" level signal is inputted to the I/O pad 5. That is, it should be noted about a consideration in the case that the potential of the I/O pad 5 is a power supply voltage level VDD.

FIG. 5A is a graph for showing a dependency of a drain current $I_D$ (a current flowing into the drain of the PMOS transistor) of the PMOS transistor on the gate-source voltage $V_{GS}$. In the case that the gate-source voltage $V_{GS}$ is lower than the threshold voltage $V_{PTH}$ (<0V), the PMOS transistor is kept in a high reversing region (a saturation region) and then a saturated drain current $I_D$ flows. As the gate-source voltage $V_{GS}$ becomes higher than the threshold voltage $V_{PTH}$, the PMOS transistor becomes a weak reversing region and the drain current $I_D$ is decreased in an exponential function manner as the gate-source voltage $V_{GS}$ is increased. In the weak reversing region, the sub-threshold current $I_S$ determines the drain current $I_D$. As the gate-source voltage $V_{GS}$ becomes further high (in FIG. 5A, as it becomes higher than a potential $V_X$ (>0)), the drain current $I_D$ is governed not by the sub-threshold current $I_S$ but by the backward current $I_B$ of the drain/backgate junction and the gate oxidization film tunnel current $I_G$. In this case, noticing only the sub-threshold current $I_S$, a voltage where the sub-threshold current $I_S$ starts to flow is defined as $V_{STH}$.

In addition, the drain current $I_D$ of the PMOS transistor is also influenced by the backgate-source voltage $V_{BS}$. More practically, when the backgate-source voltage $V_{BS}$ is increased from 0V, the drain current $I_D$ of the PMOS transistor is decreased. That is, when the backgate-source voltage $V_{BS}$ is increased, the sub-threshold current $I_S$ of the PMOS transistor is lowered.

In the circuit configuration of the ESD protection circuit in this embodiment, since the gate and the backgate of the PMOS transistor for a trigger are connected to a VDD power source line 21, the backward current $I_B$ and the gate oxidization film tunnel current $I_G$ contributes as a leakage current between the VDD pad 4 and the VSS pad 6, but does not contribute to the leakage current of the I/O pad 5. Accordingly, only the sub-threshold current $I_S$ of THE PMOS transistor 2 for a trigger contributes to the leakage current of the I/O pad 5.

FIG. 5B is a graph for showing operating points of PNP transistor Q2 of the SCR 1 and the PMOS transistor 2 for a trigger at the time of normal operating state. X-axis denotes a potential of N-well 12 (i.e. the drain-source voltage of the PMOS transistor 2 for a trigger) and Y-axis denotes a base current $I_{PNP}$ of PNP transistor Q2 and a sub-threshold current $I_{PMOS}$ of the PMOS transistor 2 for a trigger.

Operating points of PNP transistor Q2 and the PMOS transistor 2 for a trigger become the crossing point between the graph of the base current $I_{PNP}$ and the graph of the sub-threshold current $I_{PNP}$ because the base current $I_{PNP}$ of PNP transistor Q2 and the sub-threshold current $I_{PMOS}$ of the PMOS transistor 2 for a trigger are coincided to each other during normal operation. That is, during normal operation, the leakage current $I_{LEAKAGE}$ of the I/O pad 5 is coincided with a current at the crossing point between the graph of base current $I_{PNP}$ and the graph of sub-threshold current $I_{PMOS}$.

In the ESD protection circuit of the embodiment, the operating point is moved toward a direction where the leakage current $I_{LEAKAGE}$ is reduced due to a voltage drop caused by the emitter-base voltage of PNP transistor Q2. Although it is certain that a value of the emitter-base voltage is slight (more typically, several tens mV), it may produce a substantial effect in which the voltage drop caused by the emitter-base voltage reduces the leakage current $I_{LEAKAGE}$ because the sub-threshold current $I_{PMOS}$ is decreased in a manner of exponential function in respect to the gate-source voltage $V_{GS}$. More practically, the leakage current $I_{LEAKAGE}$ is reduced by one digit due to the emitter-base voltage of several tens mV. Test production and evaluation of the ESD protection circuit of the embodiment through CMOS process of 65 nm showed that the leakage current of 10-13 (A) or less could be realized through application of the PMOS transistor 2 for a trigger with $V_{STH}$ being 0.2 V.

Subsequently, a principle in which a trigger voltage when an ESD stress of positive voltage for the VSS pad 6 is applied to the I/O pad 5 is reduced will be described in reference to the configuration of the ESD protection circuit of the embodiment. In regard to the case in which the ESD stress of a positive voltage for the VSS pad 6 is applied to the I/O pad 5, it should be noticed that a potential of the VDD pad 4 is a floating one.

Figure 6:
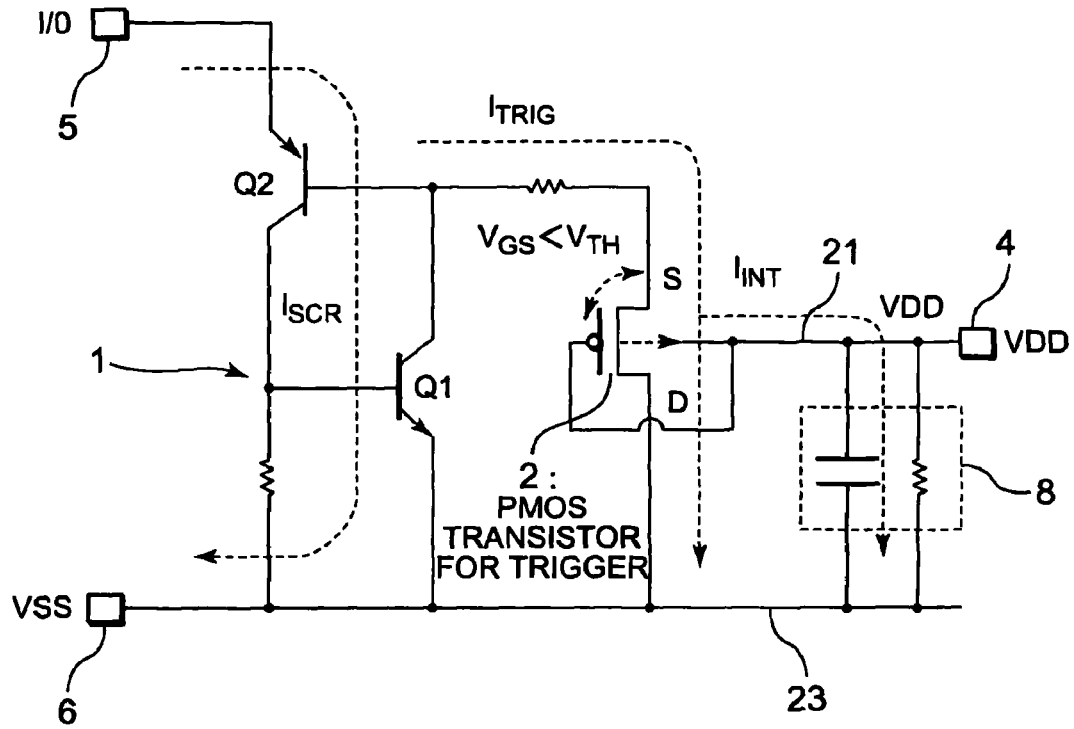
FIG. 6 is a view for indicating an equivalent circuit for the ESD protection circuit of the first embodiment when the ESD stress of a positive polarity is applied to the I/O pad with respect to the VSS pad.

In reference to FIG. 6, when the ESD stress of a positive voltage for the VSS pad 6 is applied to the I/O pad 5, the gate and the backgate of the PMOS transistor 2 for a trigger are also a floating one because the potential of the VDD pad 4 is a floating one. Accordingly, the potential of the I/O pad 5 required for making a state in which the PMOS transistor 2 for a trigger is ON (i.e. a state in which the gate-source voltage $V_{GS}$ of the PMOS transistor 2 for a trigger is lower than the threshold voltage $V_{TH}$) is low. Accordingly, it is possible to generate a trigger current $I_{TRIG}$ by turning on the PMOS transistor 2 for a trigger even with a low trigger voltage. Upon flowing of the trigger current $I_{TRIG}$, the SCR 1 starts to operate and the SCR current $I_{SCR}$ flows. The SCR current $I_{SCR}$ flows into the VSS pad 6 through the SCR 1. With this operation, an electrical load accumulated in the I/O pad 5 is electrically discharged to the VSS pad 6.

Although current $I_{INT}$ also flows into the VDD power supply line 21 through a parasitic diode between the source and the backgate of the PMOS transistor 2 for a trigger, this current $I_{INT}$ does not prevent the PMOS transistor 2 from being turned on and starting an operation of the SCR 1. Since the VDD power supply line 21 connected to the internal circuit 8 has a sufficient capacity, a state in which the gate-source voltage $V_{GS}$ is lower than the threshold voltage $V_{TH}$ is kept until the VDD power source line 21 is charged up, and then the channel current of the PMOS transistor 2 for a trigger is continued to flow.

Since channel current in the PMOS transistor 2 for a trigger becomes a trigger current $I_{TRIG}$ of the SCR 1, a trigger voltage of the SCR 1 is determined by dimensions of the PMOS transistor 2 for a trigger (i.e. a gate length L and a gate width W), a film thickness $T_{OX}$ and the threshold voltage $V_{TH}$ of the PMOS transistor 2 for a trigger. In this case, the threshold voltage $V_{TH}$ is defined as a gate-source voltage $V_{GS}$ when the drain-source current $I_{DS}$ shows a value of −1 µA. As a result of test manufacturing and evaluation of the ESD protection circuit of the embodiment through a 65 nm CMOS process, the trigger voltage of the SCR 1 could be reduced down to 1.8V under the following conditions.

$L=0.2(\mu m)$ $W=10(\mu m)$ $T_{OX}=1.3(nm)$ $V_{TH}=-0.2(V)$

Figure 2:
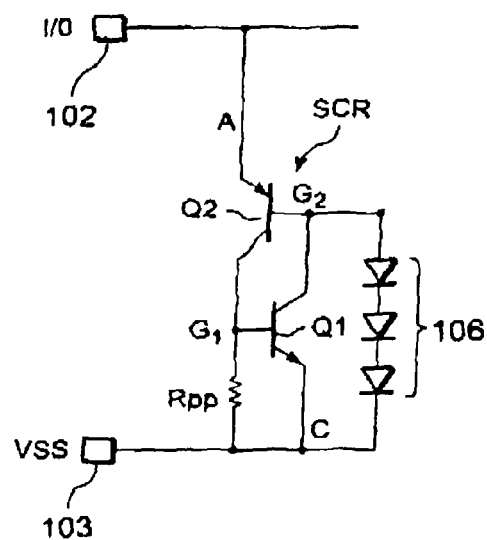
FIG. 2 is a circuit diagram for showing another example of a configuration of the related art ESD protection circuit.
Figure 3A:
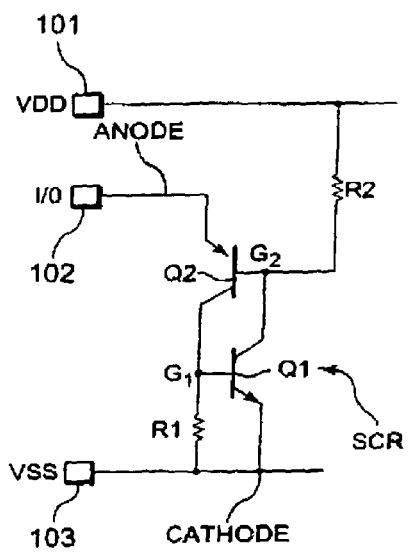
FIG. 3A is a circuit diagram for showing a still further example of a configuration of the related art ESD protection circuit.
Figure 3B:
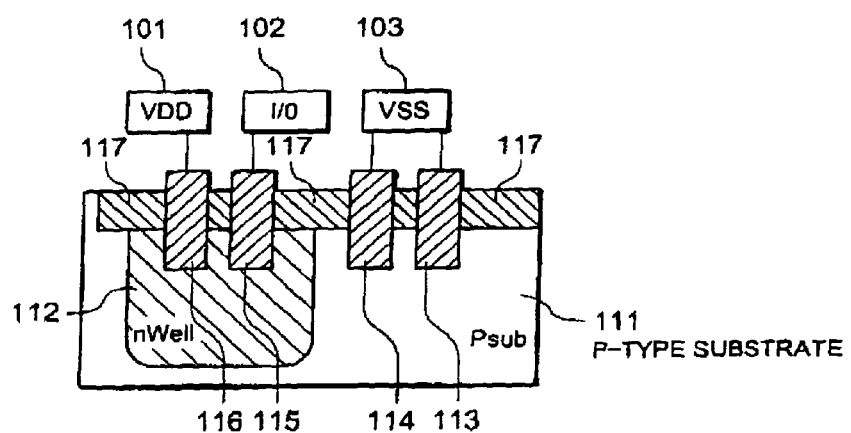
FIG. 3B is a sectional view for realizing the ESD protection circuit in FIG. 3A.
Figure 7:
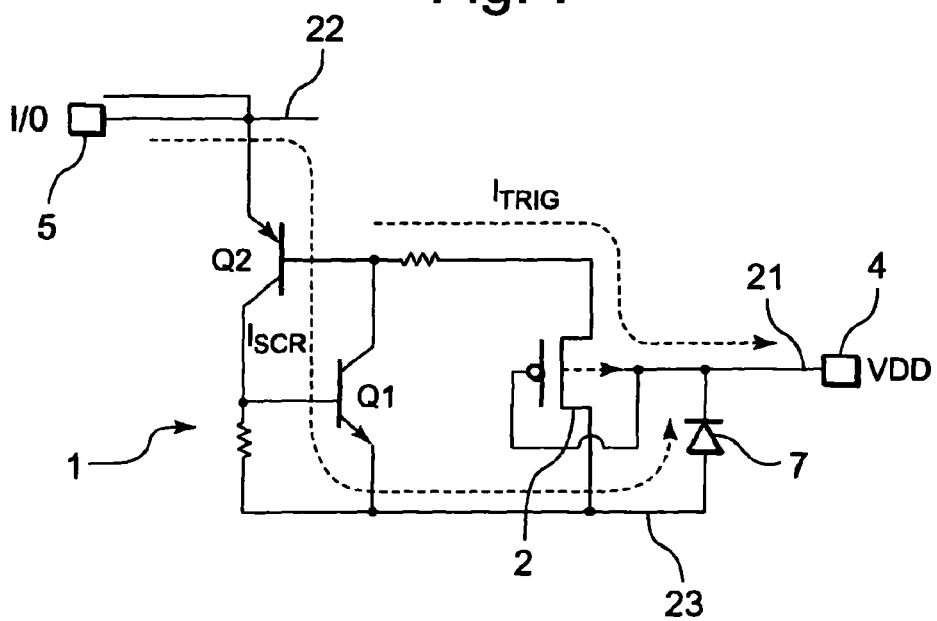
FIG. 7 is a view for indicating an equivalent circuit for the ESD protection circuit of the first embodiment when the ESD stress of a positive polarity for the VDD pad is applied to the I/O pad.

In addition, the ESD protection circuit of the embodiment also has an advantage that it has also a low trigger voltage when the ESD stress of a positive polarity for the VDD pad 4 is applied. FIG. 7 is a view for illustrating a principle where such advantage as above can be attained. In the case that the ESD stress of a positive polarity for the VDD pad 4 is applied to the I/O pad 5, current flows from the I/O pad 5 to the VDD power source line 21 through two forward diodes connected in series (i.e. emitter/base junction of PNP transistor Q2 and source-backgate junction of the PMOS transistor 2 for a trigger). Accordingly, when it does not depend on the structure of the PMOS transistor 2 for a trigger and a potential of about 1.5 V (=approximately 0.7 V×2) of potential of forward bias of the two series-connected diodes occurs between the I/O pad 5 and the VDD pad 4, the trigger current $I_{TRIG}$ flows. Upon flowing of the trigger current $I_{TRIG}$, the SCR 1 starts to operate and the SCR current $I_{SCR}$ flows. The SCR current $I_{SCR}$ flows into the VDD pad 4 through the SCR 1 and the power clamp diode 7. With this operation, the electrical load accumulated in the I/O pad 5 is discharged to the VDD pad 4. Actually, test production and evaluation of the ESD protection circuit of the embodiment through a 65 nm CMOS process enabled the trigger voltage of the SCR 1 to be reduced down to 1.5V without being dependent on the structure of the PMOS transistor 2 for a trigger. This value is a value that cannot be obtained by the related art ESD protection circuit shown in FIGS. 1, 2 and 3.

Second Embodiment

Figure 8A:
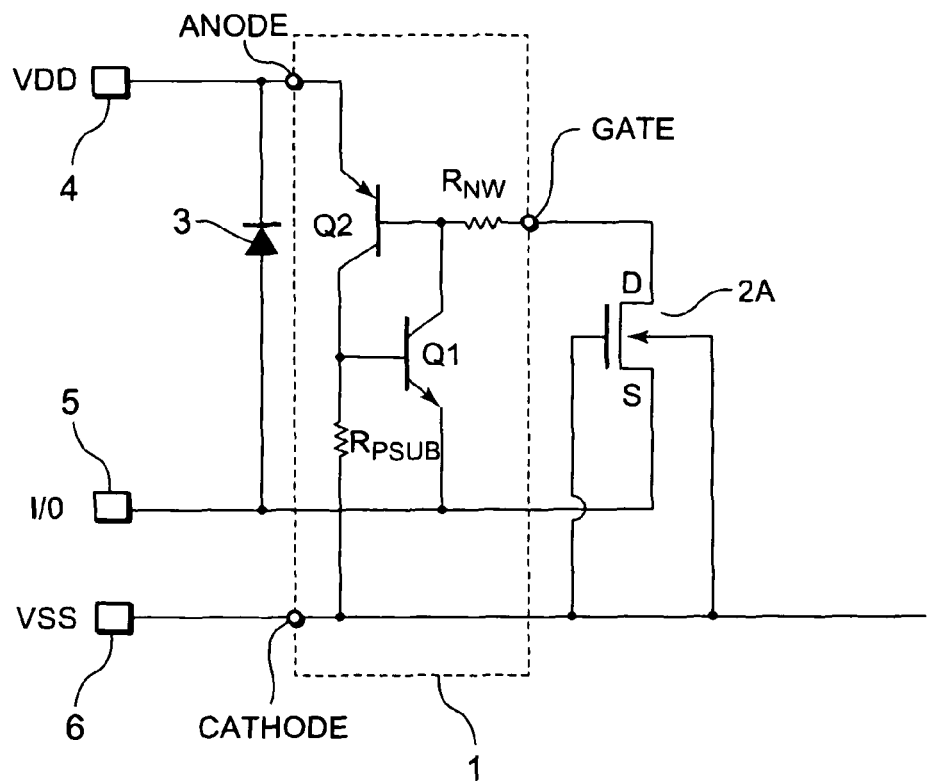
FIG. 8A is a circuit diagram for indicating a configuration of the ESD protection circuit of a second embodiment of the present invention.

FIG. 8A is a circuit diagram for showing a configuration of the ESD protection circuit of a second embodiment of the present invention. In this embodiment, the PMOS transistor is not used, but the NMOS transistor is used as a trigger element for triggering the SCR. Along with this usage, a connecting relation among the SCR, pad and trigger element is changed from that of the first embodiment.

More practically, the ESD protection circuit of the second embodiment comprises an N-gate type SCR 1, the NMOS transistor 2A for a trigger, and a backward diode 3. The anode of the SCR 1 is connected to the VDD pad 4 and its cathode is connected to the I/O pad 5. The gate of the SCR 1 is connected to the drain of the NMOS transistor 2A for a trigger. The source of the NMOS transistor 2A for a trigger is connected to the I/O pad 5 and its gate and backgate are connected to the VSS pad 6.

Figure 8B:
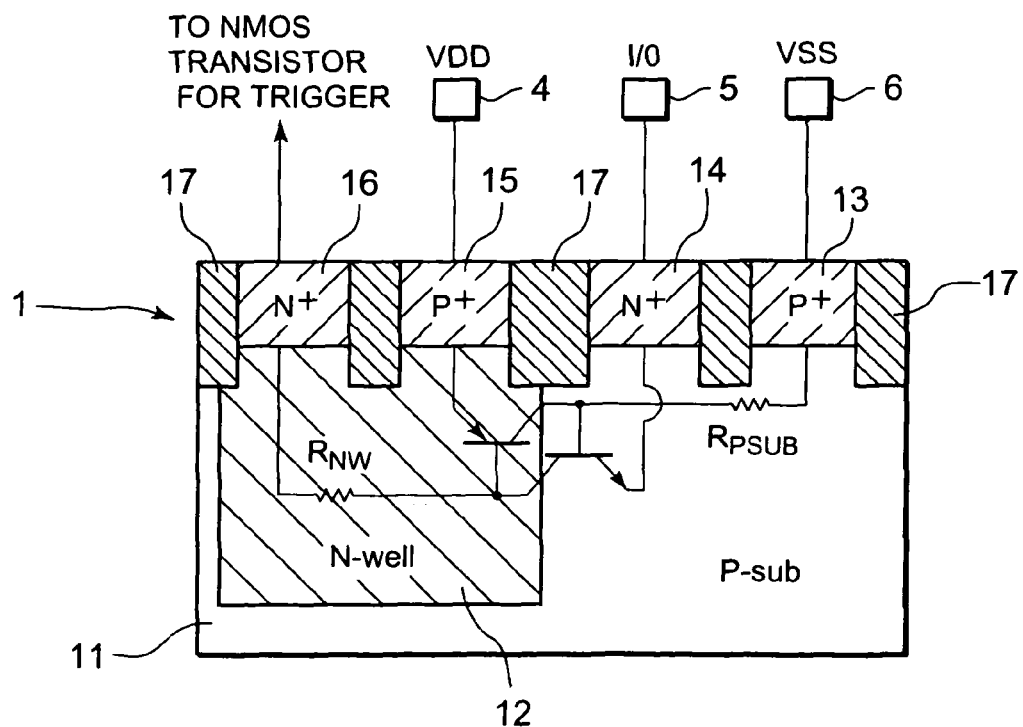
FIG. 8B is a sectional view for indicating a sectional structure of a SCR included in the ESD protection circuit of FIG. 8A.

FIG. 8B is a sectional view for showing a connected relation among the SCR 1 and each of the pads 4 to 6. The P+ region 13 formed at the p-type substrate 11 is connected to the VSS pad 6 and the N+ region 14 is connected to the I/O pad 5. The N+ region 14 may act as the cathode for the SCR 1. The P+ region 15 formed at the N-well 12 is connected to the VDD pad 4 and the N+ region 16 is connected to the drain of the NMOS transistor 2A for a trigger. The P+ region 15 may act as an anode for the SCR 1 and the N+ region 16 may act as a gate for it.

According to the configurations shown in FIG. 8A and FIG. 8B, it is possible to reduce a trigger voltage when the ESD stress of a negative polarity for the VDD pad 4 is applied to the I/O pad 5 due to the same reasons as that for the ESD protection circuit of the first embodiment. For a detail, since the VSS pad 6 is of a floating condition, the gate and backgate of the NMOS transistor 2A for a trigger are also of a floating condition. Thus, an amplitude of the ESD stress of negative polarity required for making a state in which NMOS transistor 2A for a trigger is turned on (i.e. the gate-source voltage $V_{GS}$ becomes higher than the threshold voltage $V_{TH}$) is low. Accordingly, the ESD protection circuit of the second embodiment enables a trigger voltage when the ESD stress of negative polarity for the VDD pad 4 is applied to the I/O pad 5 to be lowered.

In addition, the ESD protection circuit of the second embodiment enables the leakage current in the ESD protection circuit to be reduced due to the same principle as that of the first embodiment by defining a restriction in which a signal level of a signal inputted or outputted for the I/O pad 5 is always higher than the ground level VSS (i.e. "Low" level of a signal inputted or outputted for the I/O pad 5 is defined as a predetermined potential higher than the ground level VSS). For more details, according to such an operation as above, since the VSS pad 6 is kept at the ground level VSS during normal operation, the gate and the backgate of the NMOS transistor 2A for a trigger are also kept at the ground level VSS. In turn, since the I/O pad 5 is always kept at a higher potential than the ground level VSS, the source of the NMOS transistor 2 for a trigger is kept at a higher potential than the ground level VSS. Accordingly, the gate-source voltage $V_{GS}$ of the NMOS for a trigger becomes a negative voltage. Since a threshold current of the NMOS transistor 2A for a trigger becomes quite low if the gate-source voltage $V_{GS}$ is negative, the leakage current in the ESD protection circuit becomes quite low. In this way, the ESD protection circuit of the second embodiment can reduce the leakage current in the ESD protection circuit by properly operating the semiconductor integrated circuit.

Although the embodiments of the present invention have been described in various manners, it should not be interpreted that the present invention is restricted to the above-mentioned embodiments. In particular, although the configuration having P+ region 13 and N+ region formed in the P-type substrate 11 has been indicated, it is also possible to cause P+ region 13 and N+ region 14 to be formed into P-wells. In this case, the P-wells are formed to be connected adjacent to the N-well 12.

Further, it is noted that, Applicant's intent is to encompass equivalents of all claim elements, even if amended later during prosecution.

What is claimed is:

1. A semiconductor circuit, comprising:
    a first pad for a first power source;
    a second pad for a second power source;
    a third pad for an input/output signal;
    a silicon controlled rectifier (SCR) arranged between the third pad and the second pad; and
    a transistor functioning as a trigger element to flow a trigger current to a gate of the SCR, the transistor including a gate and a backgate being connected to the first pad,
    wherein an anode of the SCR is connected to the third pad,
    wherein a cathode of the SCR is connected to the second pad,
    wherein the gate of the SCR is connected to the source of the transistor,
    wherein the SCR comprises:
        a member of a P-type substrate or a P-well;
        a first P+ region formed in the member and connected to the second pad;
        a first N+ region formed in the member and connected to the second pad;
        an N-well formed in the P- type substrate or adjacent to the P-well;
        a second P+ region formed in the N-well and connected to the third pad; and
        a second N+ region formed in the N-well and connected to the source of the transistor, and
    wherein the first N+ region and the second P+ region are formed adjacent to each other and are formed between the first P+ region and the second N+ region.

2. The semiconductor circuit as claimed in claim 1, wherein said transistor comprises a PMOS transistor, said first power source comprises VDD, and said second power source comprises VSS.

3. The semiconductor circuit as claimed in claim 1, wherein the first N+ region is disposed adjacent to the second P+ region.

4. The semiconductor circuit as claimed in claim 1, wherein the second P+ region is disposed adjacent to the second N+ region.

5. The semiconductor circuit as claimed in claim 1, wherein the SCR further comprises:
    a field oxide film that abuts the second P+ region and the first N+ region.

6. The semiconductor circuit as claimed in claim 1, wherein the first P+ region, the first N+ region, the second P+ region, and the second N+ region are disposed in order in the SCR.

7. The semiconductor circuit as claimed in claim 1, wherein the first N+ region comprises the cathode of the SCR.

8. The semiconductor circuit as claimed in claim 1, wherein the second P+ region comprises the anode of the SCR.

9. The semiconductor circuit as claimed in claim 1, wherein the second N+ region comprises the gate of the SCR.

10. The semiconductor circuit as claimed in claim 1, wherein the SCR further comprises:
    an NPN transistor; and
    a resistor disposed in one of the P-type substrate and the P-well, said resistor applying a bias to the NPN transistor.

11. The semiconductor circuit as claimed in claim 10, wherein the resistor is electrically connected to the first P+ region.

12. The semiconductor circuit as claimed in claim 11, wherein the SCR further comprises:
   a PNP transistor; and
   a resistor disposed in the N-well, said resistor electrically connecting the second N$^+$ region to a base of the PNP transistor.

13. The semiconductor circuit as claimed in claim 1, wherein the SCR further comprises:
   a PNP transistor; and
   a resistor disposed in the N-well, said resistor electrically connecting the gate of the SCR to a base of the PNP transistor.

* * * * *